(12) United States Patent
Delage et al.

(10) Patent No.: US 6,451,659 B1
(45) Date of Patent: *Sep. 17, 2002

(54) METHOD FOR FORMING A BIPOLAR TRANSISTOR STABILIZED WITH ELECTRICAL INSULATING ELEMENTS

(75) Inventors: Sylvain Delage, Bures sur Yvette; Simone Cassette, Limours; Achim Henkel, Versailles; Patrice Salzenstein, Montigny le Bretonneux, all of (FR)

(73) Assignee: Thomson-CSF, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/453,576

(22) Filed: Dec. 3, 1999

Related U.S. Application Data

(62) Division of application No. 09/086,599, filed on May 29, 1998, now Pat. No. 6,031,255.

(30) Foreign Application Priority Data

May 30, 1997 (FR) .............................................. 97 06682

(51) Int. Cl.⁷ .............................................. H01L 21/331
(52) U.S. Cl. ...................................... 438/312; 438/318
(58) Field of Search ................................ 438/312, 313, 438/315, 318, 518, 519, 520

(56) References Cited

U.S. PATENT DOCUMENTS

| | | | |
|---|---|---|---|
| 4,683,487 A | | 7/1987 | Ueyanagi et al. |
| 5,147,775 A | * | 9/1992 | Ota et al. |
| 5,166,081 A | * | 11/1992 | Inada et al. |
| 5,194,403 A | | 3/1993 | Delage et al. |
| 5,332,912 A | | 7/1994 | Nozu et al. |
| 5,411,632 A | | 5/1995 | Delage et al. |
| 5,436,181 A | | 7/1995 | Morris et al. |
| 5,668,388 A | | 9/1997 | Delage et al. |
| 5,689,212 A | | 11/1997 | Floriot et al. |
| 5,719,433 A | | 2/1998 | Delage et al. |
| 5,734,193 A | | 3/1998 | Bayraktaroglu et al. |
| 5,777,389 A | | 7/1998 | Hattori |

FOREIGN PATENT DOCUMENTS

| | | |
|---|---|---|
| EP | 0 188 897 | 7/1986 |
| EP | 0 430 086 A2 | 6/1991 |
| EP | 0 559 182 A2 | 9/1993 |
| EP | 0 752 723 A1 | 1/1997 |
| EP | 0 756 322 A1 | 1/1997 |

OTHER PUBLICATIONS

Kamiya, et al. "The Electrical Characteristics of Boron–Implanted InP", Journal of the Electrochemical Society, vol. 133, No. 4 (1986), pp. 780–784.

Ahmari, et al. "High–Speed InGaP/GaAs HBT's with a Strained $In_xGa_{1-x}As$ Base," IEEE Electron Device Lett., vol. 17, No. 5, May 1996.

Henkel, et al., "Collector–Up InGaP/GaAs–Double Heterojunction Bipolar Transistors with High f/max," Electronics Lett., vol. 33, No. 7, Mar. 1997, pp. 634–636.

Lee, et al., "Effect of Emitter–Base Spacing on the Current Gain of AlGaAs/GAs Heterojunction Bipolar Transistors," IEEE Electron Device Lett., vol. 10, No. 5, May 1989, pp. 200–202.

* cited by examiner

*Primary Examiner*—Tuan H. Nguyen
(74) *Attorney, Agent, or Firm*—Oblon, Spivak, McClelland, Maier & Neustadt, P.C.

(57) ABSTRACT

A semiconductor component of the heterojunction bipolar transistor type comprises, on a substrate, a collector, a base and a mesa-shaped emitter resting on the base. The bipolar transistor furthermore comprises electrically insulating elements in contact with the base and the flanks of the emitter mesa, said elements having a width of the same magnitude as the width of the mesa and providing the component with greater stability. Furthermore, a method for the manufacture of a component of this kind comprises in particular a step for the ion implantation of insulating ions through the constituent layer of the emitter mesa so as to define the electrically insulating elements.

5 Claims, 8 Drawing Sheets

METHOD FOR FORMING A BIPOLAR TRANSISTOR STABILIZED WITH ELECTRICAL INSULATING ELEMENTS

This application is a Division of application Ser. No. 09/086,599 filed on May 29, 1998 now U.S. Pat. No. 6,031,255.

BACKGROUND OF THE INVENTION

1. Field of the Invention

The field of the invention is that of bipolar transistors and especially vertical structure heterojunction bipolar transistors in which the current is conveyed perpendicularly to the surface of the substrate. These transistors are used for microwave applications.

A bipolar transistor is constituted by a stack of layers of semiconductor materials, of which at least one surface layer is etched in a mesa formation, namely a raised or embossed pattern. FIG. 1 illustrates a standard structure of a heterojunction bipolar transistor or HBT comprising a substrate S, a sub-collector SC, a collector C, a base B and an emitter E. Conventionally, a contact CE is made on the surface of the emitter by the superimposition of matched layers. Laterally, two contacts $CB_1$ and $CB_2$ are also made in the collector on either side of the base.

This type of vertical structure raises a problem of electron/hole recombination at the free surfaces $S_1$ and $S_2$ shown in FIG. 1. These recombinations play a major role in the deterioration of current gain.

The smaller the size of the transistors, the greater is this phenomenon, with the surface recombination phenomena playing a greater role. Consequently, the microwave applications of such structures are heavily penalized by this problem. Indeed, for microwave operation, a bipolar transistor consists of several elementary transistors (also called fingers) positioned in parallel. To limit the base resistance, it is necessary to limit the width of the emitter and therefore the width of each finger. Typically, the width of a finger may be in the range of 2 μm for applications using frequencies below 100 GHz while the length of the finger of the emitter may be about 30 microns.

2. Description of the Prior Art

Certain solutions have already been brought to bear on this problem, especially in the context of HBT transistors made with GaAlAs/GaAs type materials. Thus, it has been proposed to introduce a passivation layer by leaving, on the surface between the emitter and the base, a semiconductor material with a wide gap that is very thin and therefore depopulated. This prevents the appearance of recombinant electrical defects at the base/passivation interface. More specifically, FIG. 2 describes a structure in which the emitter E has a special architecture obtained by the partial etching of a layer of GaAlAs deposited on a layer of GaAs constituting the base B. Two contacts $CB_1$ and $CB_2$ are made on the emitter layer on the surfaces S'1 and S'2. Then, by an appropriate treatment, these contacts may get diffused on the thickness $e_o$. In this configuration, the electron/hole recombinations in the base, which previously enjoyed favorable conditions at the free surface of the base, are limited owing to the emitter thickness $e_o$ maintained above the base. The problem of this type of structure however lies in their poor stability inasmuch as the diffusion achieved for the contacts cannot be entirely controlled and may therefore continue to undergo changes with time and temperature.

This is why the invention proposes a heterojunction bipolar transistor in which the surface recombinations are minimized through electrically insulating elements located on a part of the base and in direct contact with the flanks of the emitter mesa.

The invention can be applied to structures in which the mesa is an emitter mesa as well as to structures in which the mesa is a collector mesa.

SUMMARY OF THE INVENTION

More specifically, an object of the invention is a heterojunction bipolar transistor based on III–V semiconductor materials comprising a collector, a base and an emitter and having a mesa located on the base, said transistor furthermore comprising electrically insulating elements in contact with the free surface of the base and in contact with the flanks of the mesa, the width of said elements being of the same magnitude as the width of said mesa.

According to one variant of the invention, the mesa is an emitter mesa constituted by p doped $Ga_xIn_{1-x}P$, the base is constituted by $Ga_yIn_{1-y}As$, the electrically insulating elements being formed by $Ga_xIn_{1-x}P$ containing boron ions.

Advantageously, the mesa may comprise, on the surface, an ohmic contact layer made of refractory metal of the TiWSi, WN, TiW or other type.

According to one variant of the invention, the bipolar transistor comprises a passivation layer.

According to one variant of the invention, the bipolar transistor comprises a heat sink in the form of a bridge lying on the one hand on the mesa and on the other hand on the substrate.

An object of the invention is also a method for making a heterojunction bipolar transistor based on III–V semiconductor materials comprising the epitaxial growth of semiconductor layers including a p type (or n type) doped layer constituting the base, between two n type (or p type) doped layers constituting the emitter and the collector, wherein said transistor further comprises:

- the ion implantation, through a mask with a width l, of electrically insulating ions in the said upper layer, located above the base layer;
- the etching through a mask with a width L, greater than the width l, of the layer that has been made to be locally electrically insulating, so as to define electrically insulating elements (61) on either side of doped semiconductor elements (40).

Advantageously, the layer called the upper layer and the base layer have different types of behavior with respect to the ion implantation. Only the layer called the upper layer has its electrical properties modified by said ion implantation.

BRIEF DESCRIPTION OF THE DRAWINGS

The invention will be understood more clearly and other advantages shall appear from the following description, given by way of a non-restrictive example with reference to the appended figures, of which.

MORE DETAILED DESCRIPTION

Figure 1:
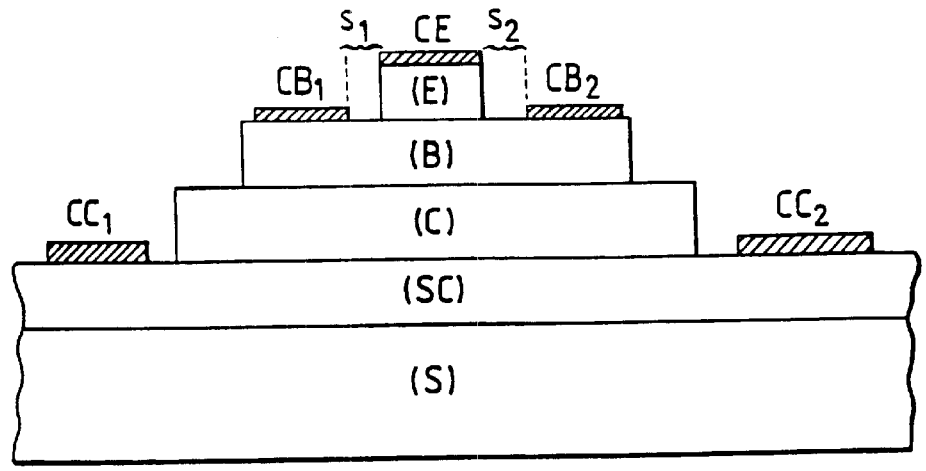
FIG. 1 illustrates a standard structure of a heterojunction bipolar transistor.
Figure 2:
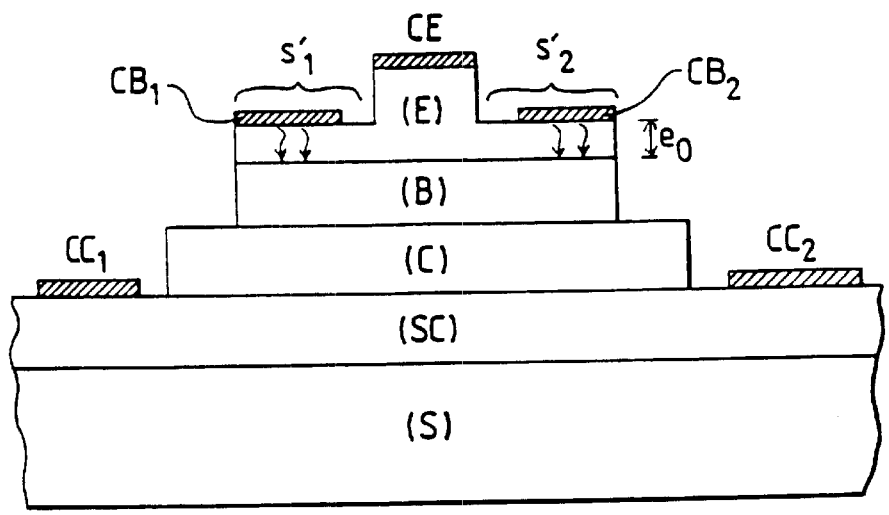
FIG. 2 illustrates a prior art heterojunction bipolar transistor in which a special architecture of an emitter mesa is used to limit the electron/hole recombination.
Figure 3:
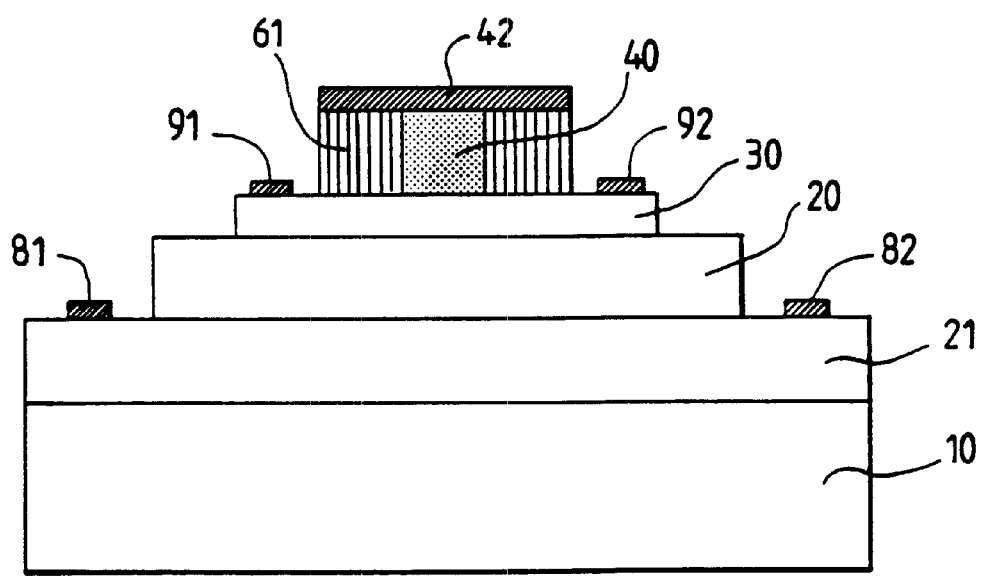
FIG. 3 illustrates a heterojunction bipolar transistor according to the invention.

The heterojunction bipolar transistor according to the invention is shown schematically in FIG. 3, in the case of a structure with the emitter at the top (it must be noted that the invention can also be applied to the case of a structure with a collector at the top). The bipolar transistor according to the invention comprises a substrate 10, a sub-collector 21, a collector 20, a base 30 and an emitter 40. Ohmic contacts 81 and 82 of the collector are located on the sub-collector layer 21, base ohmic contacts 91, 92 are located on the base on either side of the emitter mesa 40 whose flanks are in contact with electrical insulating elements 61. An emitter ohmic contact 42 is located on the entire mesa 40 and the insulating elements 61.

The invention shall be described more specifically in the context of $Ga_{0.5}In_{0.5}P/GaAs$, npn doped heterojunction bipolar transistors. The choice of a phosphorus-based material and an arsenic-based material provides for behavior with respect to operations such as etching or ion implantation that is different and selective from one layer to the next. This is a point of major interest in the context of the invention.

This type of transistor comprises:

a semi-insulating GaAs substrate;

a sub-collector layer made of n doped GaAs (with a typical concentration of about $4.10^{18}$ cm$^{-3}$);

an n doped GaAs collector layer (with a typical concentration of about $2.10^{16}$ cm$^{-3}$);

a base layer made of p doped GaAs (with a typical concentration of about $7.10^{19}$ cm$^{-3}$);

an emitter layer made of n doped GaInP (with a typical concentration of $3.10^{17}$ cm$^{-3}$).

GaInP emitter mesas are defined in a well-controlled manner by selective etching on GaAs. Similarly, the materials GaInP and GaAs have very different types of behavior with respect to ion implantation as shown by the curves of FIGS. 4 and 5.

The curves (a), (b), (c) and (d) respectively pertain to measurements made before, during, 10 minutes after and 1 hour after ion implantation.

Figure 4:
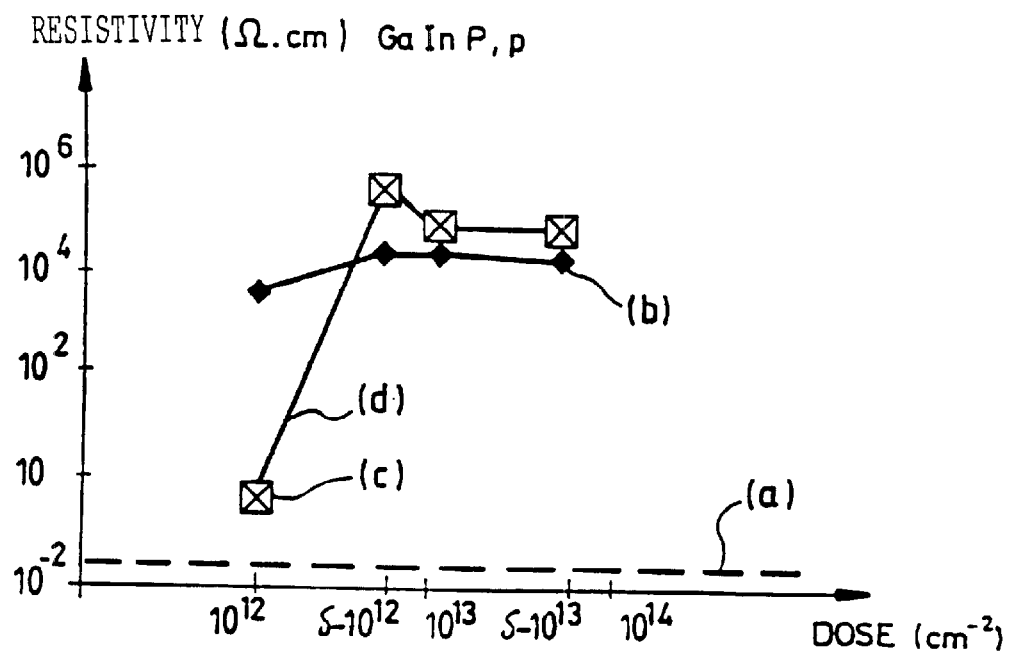
FIG. 4 illustrates the development of the resistivity of the n doped GaInP constituting an <<emitter>> layer in a transistor according to the invention, as a function of a dose of boron ions in an ion implantation step.
Figure 5:
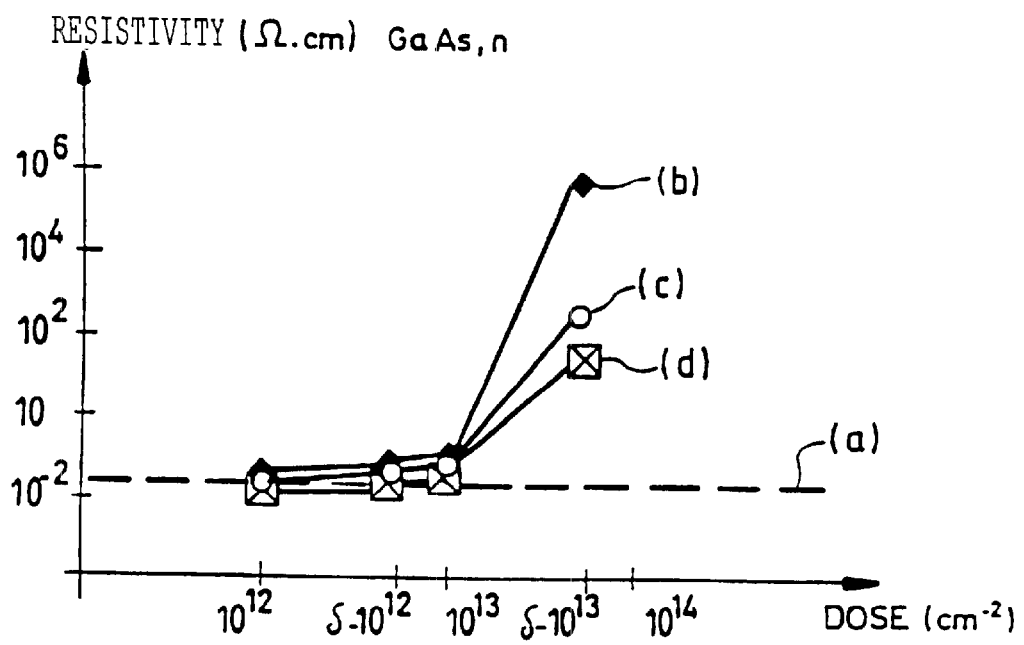
FIG. 5 illustrates the development of the resistivity of p doped GaAs constituting a base layer in a transistor according to the invention as a function of a dose of boron ions in an ion implantation step.

FIGS. 4 and 5 show the difference in sensitivity of the electrical conductivity (respectively) of n doped GaInP and p doped GaAs, with boron implantation at 200 kV as a function of the dose of ions deposited. The figures track the changes in electrical conductivity as a function of the annealing time at 416° C. In the case of n type GaInP, the material has electrical resistivity greater than $10^5$ ohms.cm for implantation doses of $5.10^{12}$ cm$^{-2}$. By means of this phenomenon, it is possible to make the n doped GaInP layers practically insulating so as to define the elements 61 mentioned here above whereas, at the same time, a layer of p doped GaAs keeps practically the same electrical resistivity.

A more detailed description shall now be given of the method of manufacture according to the invention used to obtain a heterojunction transistor of this type. This method comprises the main steps illustrated in FIGS. 6a to 6f.

Using a GaAS substrate 10, the epitaxial growth of the following layers is achieved:

a sub-collector layer 21 (n doped GaAs);

a collector layer 20 (n doped GaAs);

a base layer 30 (p doped GaAs);

an emitter layer 40 (n doped GaInP);

a contact layer 41 (GaInAs);

A layer 42 of refractory metal (TiWSi, WN; TiW, . . . ) is deposited off-site in order to provide the refractory ohmic contact.

Figure 6A:
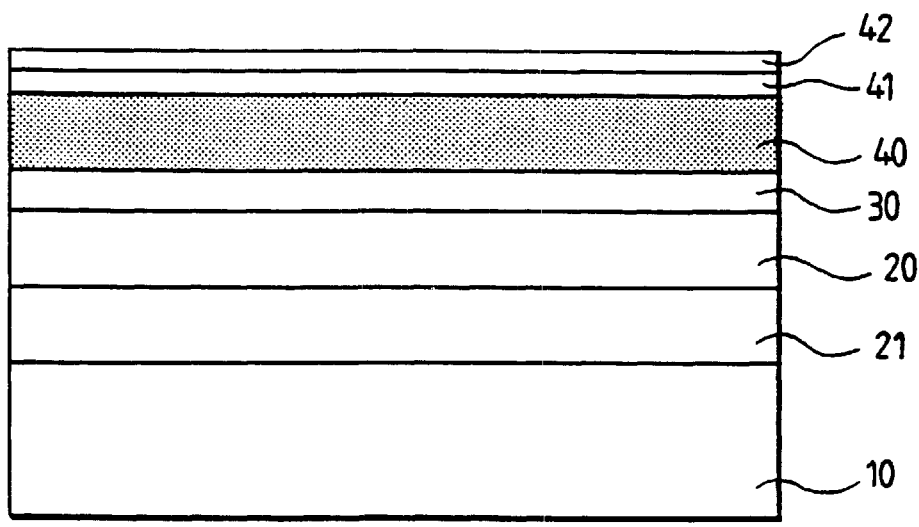
FIGS. 6a, 6b, 6c, 6d, 6e and 6f illustrate the main steps of a method for the manufacture of a transistor according to the invention.

A major advantage of the use of a refractory material arises out of the possibility of annealing the structure after the definition of the emitter mesa (described here below) so as to facilitate the removal of hydrogen trapped essentially in the base semiconductor layer during epitaxy. Indeed, the refractory metal is used to support the high temperatures needed for the detrapping of the hydrogen. It must be noted that the presence of the mesa increases the probability of the exodiffusion of the hydrogen trapped in the base acceptor atoms which are confined in the potential well brought about by the junctions. The stacking of the layers thus made is illustrated in FIG. 6a.

Figure 6B:
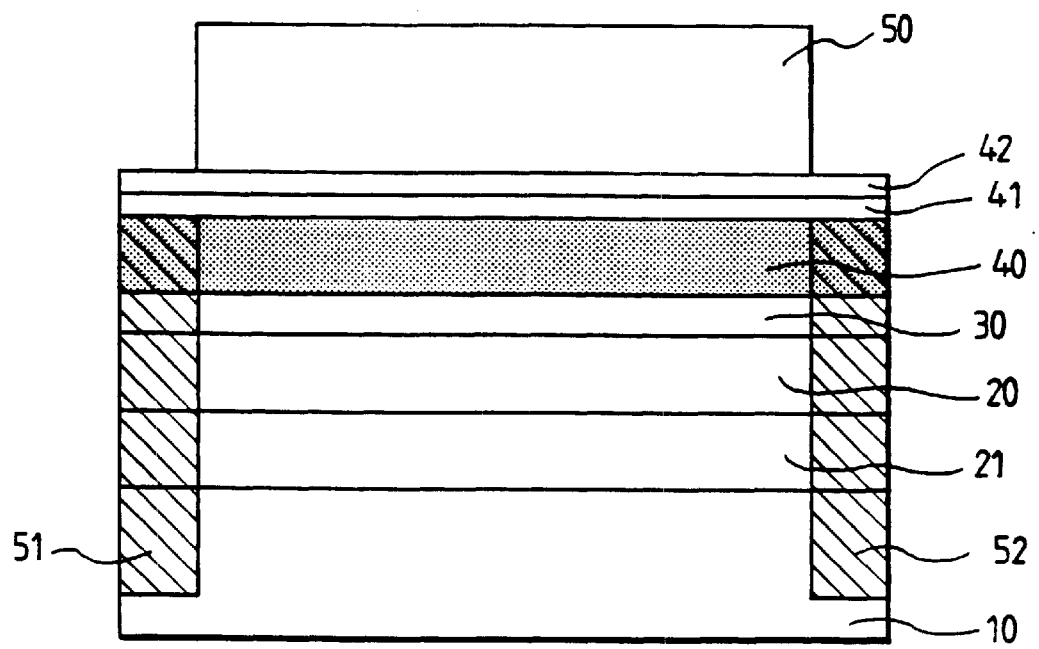
Figure 6C:
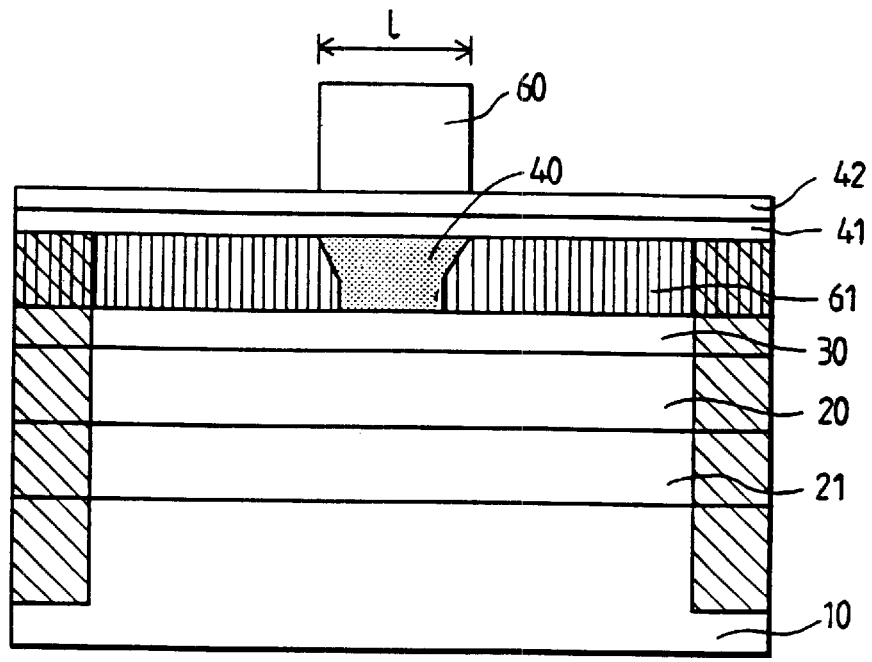

In a second stage, in order to insulate the bipolar transistors, which are made in a batch out of a common substrate, implantation protection masks 50 are made out of resin and a deep electrically insulating ion implantation (H, He, B, O, F, . . . ) is carried out in order to reduce the parasites of the component and obtain intercomponent insulation by means of insulation wells 51 and 52 (FIG. 6b).

Then, a thickening metallization 60, with a width l, is deposited, then the emitter ohmic contact is deposited by a standard lift-off method, and then a selective passivation ion implantation is done with boron at 200 kV so as to define the insulating region 61 in the emitter layer 40. The implantation step leads inherently to the recessed mesa 40 shown in FIG. 6c. The metallization 60 may be made of Ti/Au, with a typical width of 2 μm and a thickness of about 1 μm. Owing to the presence of the metallization on the emitter, the semiconductor materials protected by this mask have their initial conductivity preserved. The thickness of the metallization made of refractory material is sufficiently small to enable the ions to cross it without major loss of energy. The boron implantation dose is $2.5 \cdot 10^{12}$ cm$^{-2}$ so much so that only the layer of GaInP exposed is made insulating. The tail end of distribution of the ions goes through the base without disturbing it owing to the low sensitivity of this material to implantation. By contrast, the GaAs collector with weak n type doping (of about $2.10^{16}$ cm$^{-3}$) may also be slightly modified electrically by this tail end of distribution without major drawbacks.

Figure 6D:
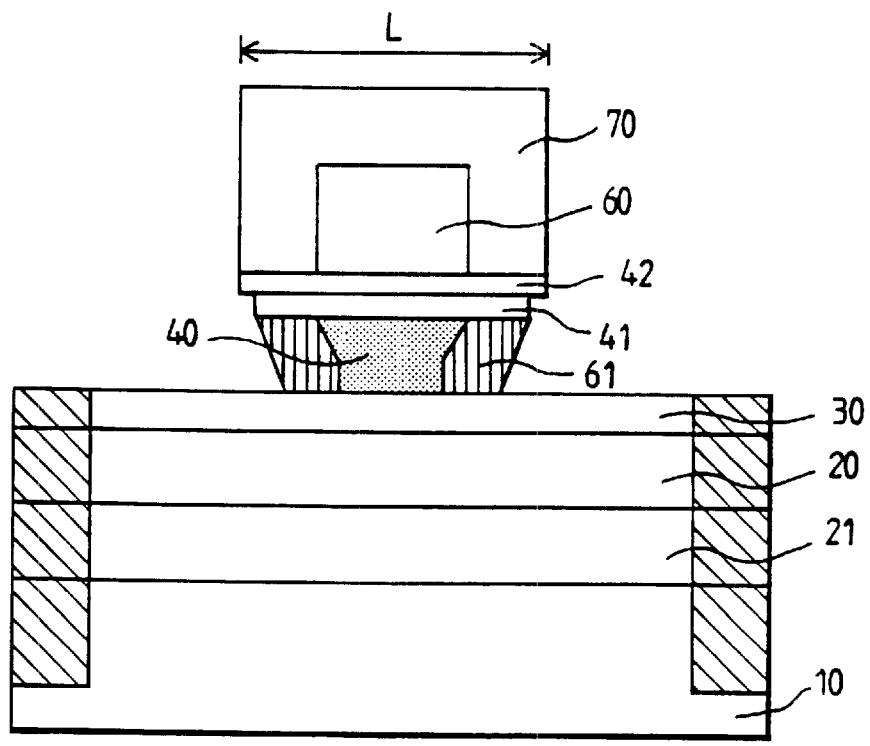

A second etching mask of photosensitive resin 70 with a width L is made. The refractory metal is etched by $SF_6$ based reactive dry etching. Then, the layer 41 of GaAs is etched by $SiCl_4$ based reactive ion etching and the boron-implanted GaInP layer 61 is subjected to Hcl based chemical etching. Typically, the GaAs layer may be etched by chlorinated reactive ion etching such as $SiCl_4$ or else by wet etching using citric acid for example. The GaInP may be etched with a solution based on pure or diluted hydrochloric acid. Thus, electrical insulating elements 61 are defined on either side of the emitter mesa 40 as shown in FIG. 6d. The electrical insulating elements may typically have a width of at least 0.3 μm to passivate the base efficiently. The width of 1 μm provides for an efficient compromise for obtaining microwave components. Indeed, the microwave gain drops by about 1 dB to 10 GHz per spacing micron between the active zone of the emitter and the edge of the strip of the base ohmic contact. This is because of the increase in the access resistance of the base and the base-collector capacitor.

Figure 6E:
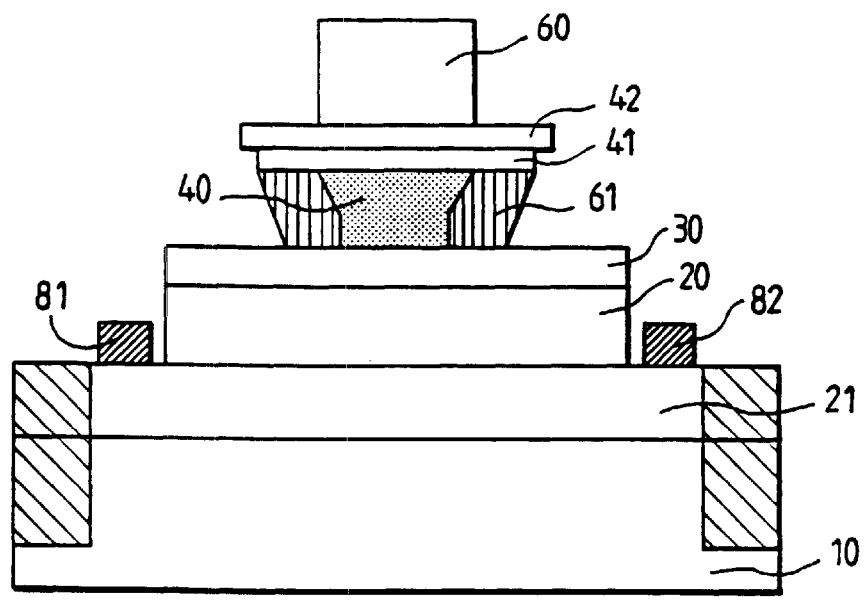

In a subsequent step shown in FIG. 6e, the base mesa is etched by dry etching (chlorinated,RIE) or combined etching (RIE and then chemical etching) and then the collector ohmic contacts 81 and 82 are made.

Figure 6F:
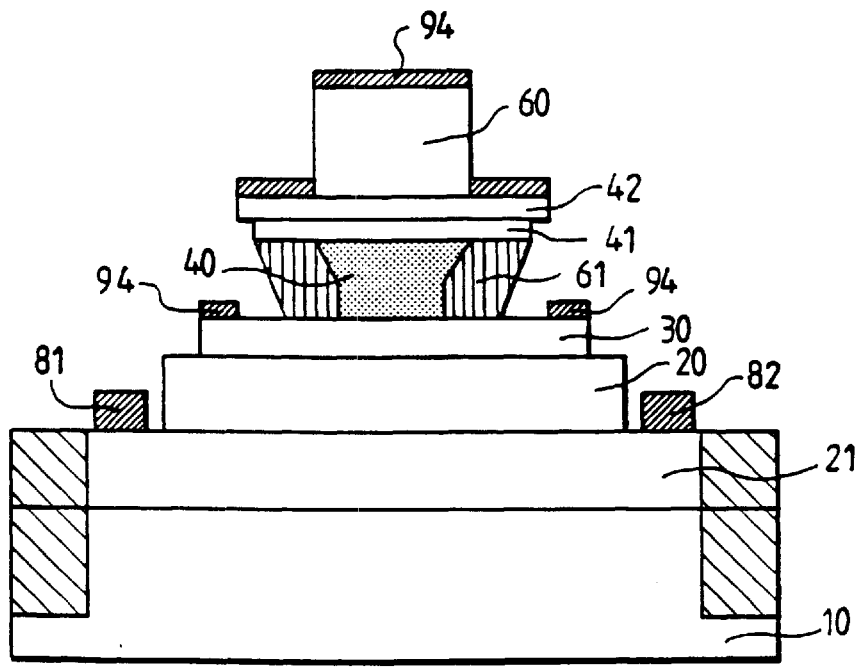

Then the base ohmic contact is made. This base ohmic contact takes the form of a metal layer 94 and is self-aligned with the mesa of the emitter. Then the extrinsic base is etched in order to reduce the base-collector parasitic capacitance as shown in FIG. 6f. The metallization of the ohmic contact can be made for example with a Ti/Pt/Au or Mo/Au alloy. The use of a metallization that does not contain any Pt or Pd may prevent the appearance of a catalytic reaction with the ambient molecular hydrogen. The overhang of about 0.1 μm, easily obtained beneath the refractory metal (in the case of the wet etching of the upper layer based on arsenide compounds), enables a thick base metallization that is favorable to the microwave operation of the component, in limiting the phenomena propagated at high frequency in the strips of the base.

Figure 7:
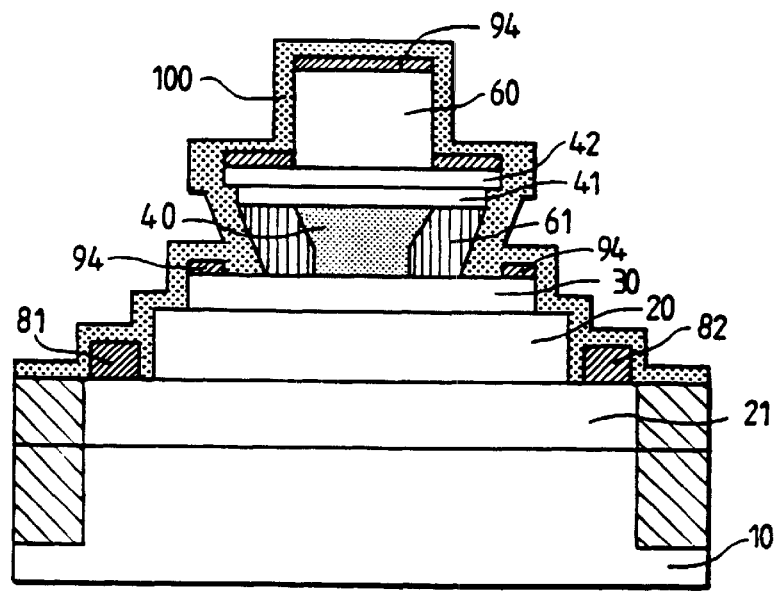
FIG. 7 illustrates an exemplary bipolar transistor comprising a passivation layer.
Figure 8:
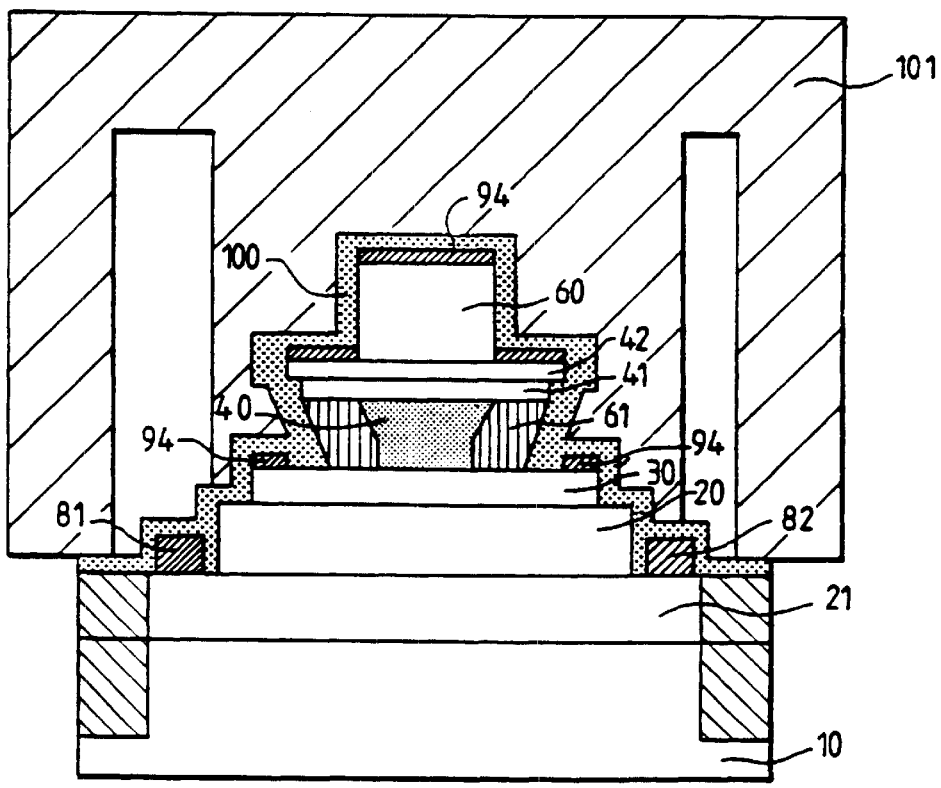
FIG. 8 illustrates a first exemplary bipolar transistor comprising a heat sink lying especially on the mask with a width l.
Figure 9:
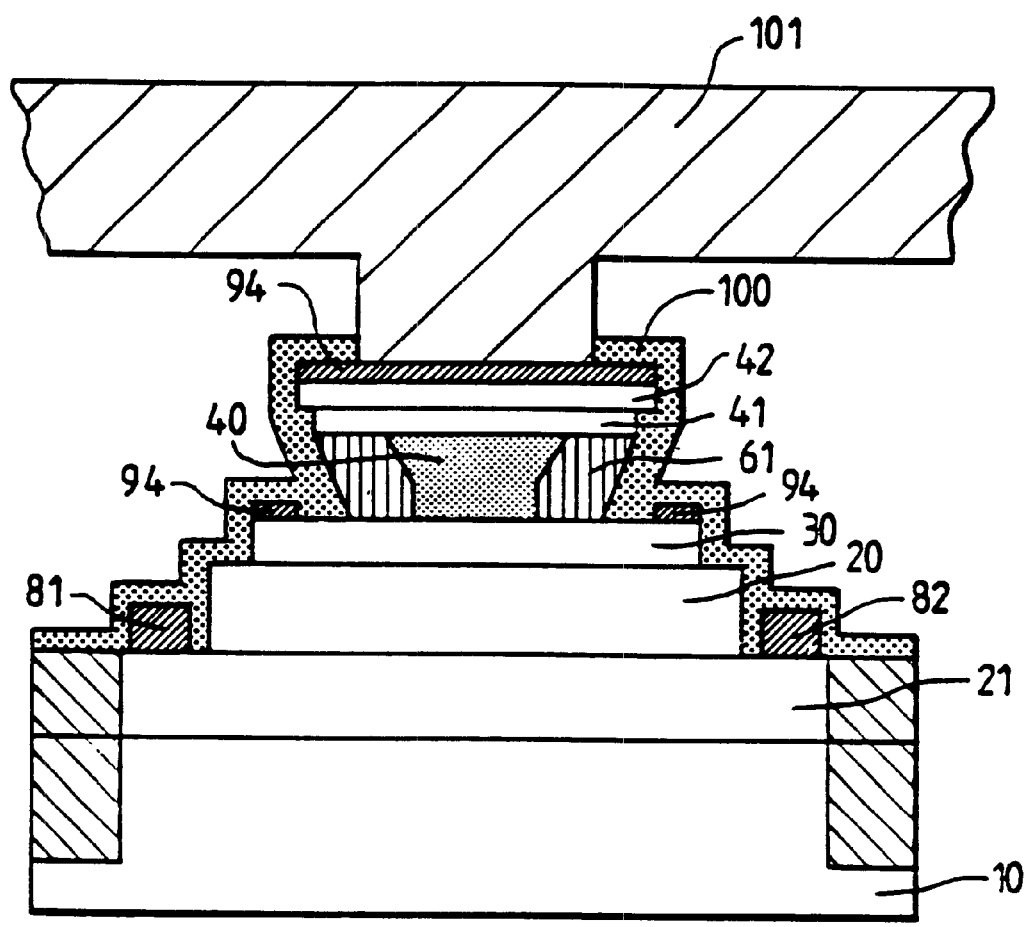
FIG. 9 illustrates a second exemplary bipolar transistor comprising a heat sink lying on the mesa without a mask with a width l.

This method and the component resulting therefrom have a certain number of advantages, including the following:

the thick elements 61 provide for thick passivation and hence excellent long-term stability;

the use of a refractory metal 42 makes it possible to envisage an easier removal of the hydrogen present in the base after the definition of the emitter mesa and therefore enables an increase in the reliability of the device;

the method described here above remains compatible with the presence of a more conventional thin passivation layer and also with the presence of a ballast resistor integrated into the emitter layer as described in the French patent application published under No. 2 736 468 and filed by the present Applicant. An exemplary transistor according to the invention comprising a passivation layer 100 is illustrated in FIG. 7.

the component obtained is compatible with the making of an upper heat sink as described in the French patent application published under No. 2 737 342 and filed by the present Applicant. An exemplary component according to the invention comprising a passivation layer 100 and a heat sink 101 is illustrated in FIG. 8. In the above description, the mask element 60 is a metal element. This mask element may also be made of resin and subsequently eliminated. In this case, the heat sink may lie directly on the layer 94 in contact with the level of the emitter. Indeed, the total width of the unit comprising the mesa 40 and the elements 61, namely the dimension L, is sufficient to locally clear the passivation layer 100 and make the heat sink lie directly on the layer 94, as illustrated in FIG. 9.

What is claimed is:

1. A method of making a heterojunction bipolar transistor, comprising:

epitaxially growing at least three semiconductor layers of III–V semiconductor material as an upper layer, a middle layer, and a lower layer on a substrate;

providing the middle layer with a first conductivity type and the upper and lower layers with a second conductivity type so that the middle layer can function as a base of the heterojunction bipolar transistor while the upper layer can function as either an emitter or a collector of the heterojunction bipolar transistor;

providing a first mask having a width l over the at least three semiconductor layers;

implanting electrically insulating ions in the upper layer on at least two opposite sides of the first mask to form electrically insulating regions in the upper layer on opposite sides of a central region of said second conductivity type;

forming a second mask of width L over the three semiconductor layers, said width L being greater than the width l; and etching at least a part of the electrically insulating regions on the opposite sides of said central region using the second mask so as to define an upper layer mesa above the middle base layer, said upper layer mesa including the central region formed to occupy the middle of the upper layer mesa between the electrically insulating elements on each opposite side thereof.

2. The method according to claim 1, wherein the upper layer and the middle base layer have different behavior with respect to the electrically insulating ions implanted in the upper layer.

3. The method according to claim 2, wherein the upper layer is provided with n conductivity as said second conductivity type and comprises $Ga_xIn_{1-x}P$ and the middle base layer is provided with p conductivity as said first conductivity type and is further formed of $Ga_yIn_{1-y}As$.

4. The method according to any one of claims 1 to 3, wherein the first mask is made of a Ti/Au metallization.

5. The method according to any one of claim 1 to 3, wherein the first mask comprises a resin.

* * * * *